United States Patent [19]

Graun et al.

[11] Patent Number: 4,668,749
[45] Date of Patent: May 26, 1987

[54] FLUORINE-CONTAINING COPOLYMERS, A PROCESS FOR THEIR PREPARATION AND THEIR USE

[75] Inventors: Karl Graun, Weiterstadt; Karl J. Rauterkus, Kelkheim, both of Fed. Rep. of Germany

[73] Assignee: Hoechst Aktiengesellschaft, Frankfurt, Fed. Rep. of Germany

[21] Appl. No.: 727,817

[22] Filed: Apr. 26, 1985

[30] Foreign Application Priority Data

Apr. 28, 1984 [DE] Fed. Rep. of Germany ....... 3415975

[51] Int. Cl.$^4$ ............................................. C08F 20/24
[52] U.S. Cl. ................... 526/245; 526/247; 526/249; 526/253; 526/255
[58] Field of Search ............. 526/240, 245, 247, 249, 526/253, 254, 255; 525/60

[56] References Cited

U.S. PATENT DOCUMENTS

| | | | |
|---|---|---|---|
| 2,462,347 | 2/1949 | Barrick | 526/255 |
| 2,732,370 | 1/1956 | Codding | 526/247 |
| 2,851,449 | 9/1958 | Schildknecht | 526/247 |
| 3,240,757 | 3/1966 | Sterling | 526/253 |
| 3,384,627 | 5/1968 | Anello et al. | 526/245 |
| 3,386,977 | 6/1968 | Kleiner | 526/245 |
| 3,480,605 | 11/1969 | Pittman et al. | 526/247 |
| 3,838,104 | 9/1974 | Hayashi et al. | 526/245 |

*Primary Examiner*—Paul R. Michl
*Attorney, Agent, or Firm*—Berman, Aisenberg & Platt

[57] ABSTRACT

Fluorine-containing copolymers are prepared by free radical-initiated copolymerization of ethylenically unsaturated, copolymerizable monomers, containing vinyl esters, 0.05 to 60% by weight, relative to the total amount of monomers employed, of fluorine-containing monomers in which the copolymerizable ethylene group is substituted by radicals containing fluorocarbon groups, the fluorocarbon groups being composed of at least 2 adjacent carbon atoms having F—C bonds, if appropriate, ethylenically unsaturated monocarboxylic and/or dicarboxylic acids, and if appropriate, further monomers, and, if appropriate, the subsequent partial or complete saponification of the vinyl ester units present in the resulting copolymers to give vinyl alcohol units. The fluorine-containing copolymers and, in particular, the fluorine-containing saponification products, thereof, which can have a surprisingly powerful viscosity-increasing effect in aqueous systems, all useful as emulsifiers, protective colloids or components of adhesives, for modifying the surface of organic and/or inorganic substrates, as a constituent in photosensitive layers and/or in photosensitive printing plates, for the preparation of aqueous hydraulic fluids, as auxiliaries in tertiary petroleum extraction, as paper coating agents and as sizing agents in the textile industry.

25 Claims, No Drawings

FLUORINE-CONTAINING COPOLYMERS, A PROCESS FOR THEIR PREPARATION AND THEIR USE

The invention relates to fluorine-containing copolymers containing, as monomer units, vinyl esters which, if appropriate, have been partly or completely saponified to give vinyl alcohol units, fluorine-containing, ethylenically unsaturated compounds, if appropriate ethylenically unsaturated monocarboxylic and/or dicarboxylic acids and, if appropriate, further copolymerizable compounds, the fluorine-containing monomer units in the copolymers containing, as side chains, fluorocarbon groups composed of at least 2 adjacent carbon atoms possessing F—C bonds, a process for the preparation of the copolymers and their use in various fields of application.

It is already known from U.S. Pat. No. 3,069,388 to copolymerize 3,3,3-trifluoropropane and vinyl acetate by conventional processes, such as solution, emulsion or mass processes, at 20°–80° C., using catalysts acting by a free-radical mechanism, under an excess pressure or autogenous pressure.

The copolymerization of trifluorochloroethylene with vinyl acetate and the subsequent hydrolysis of the copolymer to give the corresponding alcohols are also described in British Pat. No. 596,943. The products obtained can be vulcanized. The copolymerization of 1-chloro-2,2-difluoroethylene with vinyl acetate is known from U.S. Pat. No. 2,891,934. The saponification of the copolymers to give modified polyvinyl alcohols is not mentioned. The copolymers are used for coatings, coats of lacquer, adhesives and films.

The preparation of a thermo-reversible gel is described in U.S. Pat. No. 2,499,097. It is obtained by copolymerizing vinyl fluoride with vinyl acetate and saponifying the copolymer. It is prepared in the form of a dispersion.

The copolymerization of vinyl acetate with tetrafluoroethylene at 50° C. is described in European Polymer Journal 3 (1967), No. 1, pages 5–12. The copolymers can be converted into the corresponding fluorine-containing copolymeric polyvinyl alcohols by alkaline hydrolysis.

These products can contain up to approx. 20% by weight of fluorine, which is attached directly to the carbon atoms forming the main chains of the polymer molecules.

Photosensitive fluorine-containing polymers are known from European Published Application No. 40,841; these are employed, in particular, for the production of offset printing plates and contain comonomer units having photosensitive groups.

Copolymers formed from vinyl esters, ethylene and fluoroalkyl acrylates are known from European Published Application No. 86,406 and from Japanese Patent Application No. 81 0 1184. The copolymers are obtained in the form of a dispersion. It is not mentioned whether it is possible to saponify them to give modified polyvinyl alcohols.

The present invention was therefore based on the object of making available polymers which have improved properties, which can be used in a versatile manner and which do not have the disadvantages of the known fluorine-containing copolymers mentioned above. It was regarded as a further object, in particular, to find copolymers which can be saponified to give copolymeric, modified polyvinyl alcohols having an improved dispersibility.

It has been possible, surprisingly, to achieve the defined object by copolymerizing vinyl esters with fluorine-containing, ethylenically unsaturated monomers and, if appropriate, additionally ethylenically unsaturated monocarboxylic and/or dicarboxylic acids and, if appropriate, additionally further copolymerizable monomers, employing fluorine-containing monomers in which the copolymerizable ethylene group is substituted by radicals containing fluorocarbon groups and the fluorocarbon groups are composed of at least 2 adjacent carbon atoms having F—C bonds, so that the fluorine-containing monomer units in the copolymers contain, as side chains, fluorocarbon groups composed of at least 2 adjacent carbon atoms having F—C bonds.

The proportion of fluorine-containing comonomers according to the invention is preferably 0.05 to 60% by weight, relative to the total amount of monomers employed.

The invention relates, therefore, to fluorine-containing copolymers prepared by the free radical-initiated copolymerization of ethylenically unsaturated, copolymerizable monomers and containing, as monomer units, vinyl esters, fluorine-containing, ethylenically unsaturated monomers, if appropriate ethylenically unsaturated monocarboxylic and/or dicarboxylic acids and, if appropriate, further monomers, the vinyl ester units being, if appropriate, partly or completely saponified to give vinyl alcohol units, wherein the fluorine-containing monomer units in the copolymers contain, as side chains, fluorocarbon groups composed of at least 2 adjacent carbon atoms having F—C bonds.

Amongst the fluorine-containing monomer units in the fluorine-containing copolymers according to the invention, preferrred monomer units are those which correspond to formula I.

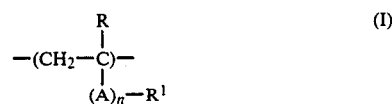

in which
R denotes H, —CH$_3$ or —CF$_3$,
A denotes —CH$_2$—, —O—, —CH$_2$—O—(CH$_2$)$_m$— or

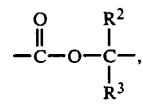

in which
R$^2$ and R$^3$, which can be identical or different, represent H, (C$_1$–C$_4$)-alkyl, —CF$_3$ or R$^1$,
n denotes 0–1, m denotes 0–2,
R$^1$ denotes —C$_p$F$_{2p+1}$, —C$_p$F$_{2p}$X, —C$_p$F$_{2p-1}$XH, which can be linear or branched, p denotes 2–20, preferably 6–12, and X denotes halogen.

If a saponification is to be carried out, vinyl acetate is preferred amongst the vinyl esters in the fluorine-containing copolymers according to the invention.

Amongst the monocarboxylic and/or dicarboxylic acid units which are present, if appropriate, in the fluorine-containing copolymers according to the invention, those of formula II

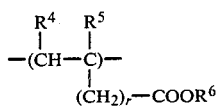

(II)

in which
R⁴ denotes H, —COOH or (C₁–C₅)-alkyl,
R⁵ denotes H, —CH₃ or —COOH, it being possible for R⁴ and R⁵ to be identical or different,
r denotes 0–5 and
R⁶ denotes H, NH₄, Na, K or Li,
are preferred.

Polymerization of monomers of formulae III and IV

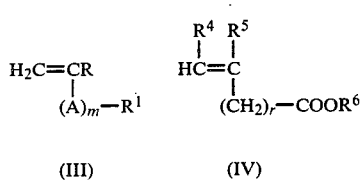

(III)        (IV)

(wherein each of R, R¹, R⁴, R⁵, R⁶, A, n and r has its previously-ascribed meaning) results in polymers containing monomer units of formulae I and II, respectively.

With regard to the saponified, fluorine-containing copolymers according to the invention, preferred copolymers are those in which the degree of saponification of their vinyl ester units to give vinyl alcohol units is 40 to 100 mole %, preferably 60–90 mole % and particularly 70 to 98 mole %.

The invention also relates to a process for the preparation of the fluorine-containing copolymers according to the invention, described above, by free radicalinitiated copolymerization of copolymerizable vinyl esters with fluorine-containing, ethylenically unsaturated monomers, if appropriate ethylenically unsaturated monocarboxylic and/or dicarboxylic acids and, if appropriate, further monomers, and, if appropriate, by subsequent partial or complete saponification of the vinyl ester units to give vinyl alcohol units, which comprises employing for the copolymerization preferably 0.05 to 60% by weight, relative to the total amount of monomers employed, of fluorine-containing monomers in which the copolymerizable ethylene group is substituted by radicals containing fluorocarbon groups, the fluorocarbon groups being composed of at least 2 adjacent carbon atoms having F—C bonds.

The copolymerization according to the invention is preferbly carried out in the mass and/or in solution.

The partial or complete hydrolysis of the vinyl ester units to give vinyl alcohol units which is to be carried out, if appropriate, in the fluorine-containing copolymers is preferably effected by alkali-catalyzed alcholysis in accordance with known methods.

Vinyl esters which are particularly suitable for use are, especially, the vinyl esters of saturated aliphatic carboxylic acids having 1–18, in particular 2–12, carbon atoms, such as, for example, vinyl formate, vinyl acetate, vinyl propionate, vinyl butyrate, vinyl laurate or vinyl stearate. They can be employed individually or as a mixture with one another. It is preferable to use vinyl acetate.

Examples of comonomers corresponding to the structural unit of the formula (I) are perfluorohexylethylene, perfluorooctylethylene, perfluoropropyl vinyl ether, allyl tetrafluoroethyl ether, allyl hexafluoropropyl ether or hexafluoroisobutene. The compounds belonging to the series of the perfluorinated α-olefins can also be employed as a mixture with one another. The perfluorocarbon part of the fluorine-containing comonomers must extend over at least two adjacent carbon atoms.

Copolymers according to the invention are obtained, for example, by copolymerizing the fluorine-containing monomers with vinyl esters of saturated aliphatic carboxylic acids in the mass or in emulsion or in suspension or preferably in solution, using conventional initiators which are suitable for free radical polymerization. The reaction can be carried out by a batch process or a metering-in process.

Preferably, 0.05–20% by weight, relative to the total amount of monomers, of the fluorine-containing comonomer are dissolved in the vinyl ester, together with the free radical initiator, and the mixture is introduced into a reaction flask and polymerized at 60°–80° C. for 5–10 hours. An organic solvent can be added, if appropriate in several portions, during the polymerization.

Examples of polymerization initiators which can be employed are organic peroxides, such as benzoyl peroxide, t.-butyl hydroperoxide, cumene hydroperoxide or dibenzoyl peroxide, azo compounds, such as azodiisobutyronitrile, and per-esters, such as t.-butyl per-2-ethylhexanoate, in an amount of 0.005–0.3% by weight, preferably 0.05–0.25% by weight, relative to the vinyl ester.

Organic solvents which can be added to the reaction solution, in an amount of 10–60% by weight, relative to the vinyl ester, are primary, secondary or tertiary aliphatic alcohols, such as, for example, methanol, ethanol or isopropanol, preferably isopropanol and methanol and particularly preferentially methanol. Esters, such as methyl acetate, are also suitable solvents.

After the removal of the organic solvent, the copolymers according to the invention, which have been prepared in this manner and are present in an alcoholic solution, can be obtained in a solid form, preferably as granules, by known drying processes. Preferably, the vinyl ester copolymers are converted into the corresponding fluorine-containing polyvinyl alcohols by partial or complete saponification of the vinyl ester units.

The saponification of the vinyl ester copolymers is preferably effected by alcoholysis. This alcoholysis is carried out in the presence of a lower alkanol, preferably an alkanol having 1, 2 or 3 carbon atoms, such as, for example, methanol, ethanol, propanol or isopropanol; methanol is particularly preferred in this respect. In general, it is possible to use the same alcohol which was, if appropriate, also present in the copolymerization carried out to obtain the vinyl ester copolymers. It is preferable to use as starting material the alcoholic solution obtained, in a given case, in the copolymerization reaction. The alcoholysis is carried out by employing the alkanol in an amount of 10–50% by weight, preferably 20–40% by weight, relative to the vinyl ester copolymer.

The alcoholysis process is carried out in the presence of a basic catalyst. The catalyst used can preferably be an alkali metal hydroxide or alkali metal alcoholate. Examples of suitable catalysts are sodium hydroxide, potassium hydroxide, NH₃, sodium methylate, ethylate and propylate, and also potassium methylate, ethylate and propylate. The basic catalyst is used in the form of a solution, an alkanol of the abovementioned type being employed as the solvent. The amount of a solution, for example 10% strength by weight, of the catalyst in an alkanol is usually 0.1–10% by weight, preferably 0.4–3% by weight, relative to the proportion of vinyl ester in the copolymer. Generally, the concentration of the catalyst in the alcoholic catalyst solution used is advantageously within the range from 5 to 25% by weight, preferably 8 to 20% by weight. The vinyl ester copolymer is saponified or alcoholyzed by dissolving it in a lower alkanol at a temperature of 10°–80° C., preferably 20°–60° C. and especially at room temperature. Specific amounts of catalyst solution are added to the homogeneous vinyl ester copolymer solution at a temperature of 10°–40° C., preferably 20°–30° C., depending on the degree of hydrolysis to be established, and vigorous stirring or mixing is carried out.

The transesterification reaction sets in immediately after the alcoholic catalyst solution has been added. Depending on the nature and amount of the vinyl ester copolymer, the time required for the transesterification is 1–130 minutes, preferably 30–90 minutes and especially 40–80 minutes.

The vinyl alcohol copolymer obtained by the transesterification reaction is neutralized, washed and dried in a customary manner. Neutralization is carried out by means of an inorganic, or preferably organic, acid, for example phosphoric acid or acetic acid.

Besides the alcoholysis described above, it is, however, also possible to apply, to the copolymers according to the invention, other saponification processes which are known for polyvinyl esters, for example saponification in an aqueous dispersion by means of methyl alcoholic or aqueous potassium hydroxide solution or by means of acid saponifying agents, such as sulfuric acid or hydrogen chloride.

The fluoroine-containing polyvinyl alcohols according to the invention can be water-soluble or soluble in water to a limited extent, swellable in water or insoluble in water, depending on the content in the polymer of the individual comonomer components.

The degree of saponification of the saponifiable structural units is within the range from 40 to 100, preferably 60–99 and especially 70–98, mole %.

The alcoholysis products or saponification products of the vinyl ester copolymers according to the invention, i.e. the vinyl alcohol copolymers, which are also according to the invention, can be used as emulsifiers, agents for increasing viscosity or protective colloids or for the preparation of aqueous hydraulic fluids and also as flooding agent additives for tertiary petroleum extraction. In general, they are suitable for the preparation of aqueous, high-viscosity vinyl alcohol copolymer solutions, whereas the corresponding starting vinyl ester copolymers can have low reduced specific viscosities in organic solvents, i.e. it is possible to formulate high concentrations of the starting vinyl ester copolymers in the methanolic saponification solutions. Conversely, the vinyl alcohol copolymers make it possible to achieve corresponding viscosities even at low concentrations in solution.

In contrast with this, the known copolymeric polyvinyl acetates which have been modified with effective amounts of tetrafluoroethylene have a high reduced specific viscosity in the solvent ethyl acetate, while the aqueous solutions of their saponification products, depending on the degree of hydrolysis, exhibit in some cases precipitations or a homogeneous solution behavior at viscosities which are merely within the range of the fairly high known solution viscosities of unmodified polyvinyl alcohols.

If external plasticizers are added, the partially hydrolyzed vinyl ester copolymers according to the invention, which can constitute terpolymers or quaterpolymers, can be extruded very readily to give films which have substantially smaller surface distortions than films formed from vinyl alcohol polymers which are not modified according to the invention.

The copolymeric polyvinyl alcohols modified according to the invention are also suitable for coating paper.

In respect of the spectrum of properties of fluorine-containing copolymers according to the invention, it has been found, surprisingly, that, for example, in particular copolymers according to the invention having comonomer units containing perfluorinated aliphatic, linear or branched radicals having up to 18, preferably up to 12 and especially 6–8, carbon atoms, even at low proportions of these fluorinated comonomer units in the copolymer, can have or produce extremely different and, in particular, unexpectedly high, solution viscosities in the saponified copolymers in aqueous phases, as a function of these proportions of fluorinated comonomer. In this respect there is, for example, a sharp increase in the solution viscosity in an aqueous phase at a constant degree of hydrolysis as the proportion of fluorinated comonomer units increases, whereas the viscosity, determined in organic solvents, such as, for example, ethyl acetate, of the unsaponified starting vinyl ester copolymer in organic solvents, decreases as the proportion of fluorinated comonomer units increases.

These surprising characteristic properties can be demonstrated convincingly, for example on vinyl acetate/perfluorooctylethylene copolymers containing approx. 0.1 to 0.4% by weight of perfluorooctylethylene units and on the vinyl alcohol copolymers prepared therefrom by saponification, containing approx. 0.2 to 0.8% by weight of perfluorooctylethylene units, at comparable degrees of saponification, by determining the viscosity numbers of the starting copolymers on 1% strength by weight solutions in ethyl acetate at 25° C. in an Ostwald viscometer, and those of their saponification products on 4% strength by weight aqueous solutions at 23° C. in a Höppler viscometer, and in each case plotting the viscosities of the two series of products on a graph against the percentage content of perfluorooctyl units.

It thus becomes possible to prepare, from modified polyvinyl acetates having low solution viscosities, modified polyvinyl alcohols having solution viscosities which are unexpectedly higher. For processability reasons this constitutes a considerable technical advantage. Furthermore, even at low contents of fluorinated comonomer units, the films of the fluorinated copolymeric polyvinyl alcohols according to the invention, obtained from an aqueous phase, exhibit a pronounced hydrophobic behavior in comparison with unmodified polyvinyl alcohol and also in comparison with polyvinyl alcohol which has been modified by tetrafluoroethylene units.

It has also been found, surprisingly, that the fluorinated copolymeric polyvinyl alcohols according to the invention possess excellent emulsifying properties.

Emulsions have been prepared for this purpose, and the appearance or migration of the phase boundary formed when the emulsions are destabilized has been observed, as a function of time, in a closed measuring cylinder.

The emulsions are prepared in such a way that they have a content of 8% by weight of copolymeric polyvinyl alcohol modified according to the invention in an emulsion containing 50% by weight of nonaqueous constituents. This is effected by dissolving 12 g of the appropriate fluorine-containing copolymeric polyvinyl alcohol in 162 g of $H_2O$, and emulsifying 150 g of monomeric vinyl acetate in this solution.

Additionally, comparison emulsions are prepared in which the emulsifier or protective colloid used is a conventional, unmodified polyvinyl alcohol having a viscosity of 26 cP and a degree of hydrolysis of 82.6–83 mole %, or a polyvinyl alcohol which contains 4.1% by weight of comonomer units of tetrafluoroethylene and has a viscosity of 40.4 mPa.s and a degree of hydrolysis of 85.9 mole %.

At comparable viscosities and degrees of hydrolysis, the copolymeric polyvinyl alcohol containing perfluorooctylethylene comonomer units exhibits a markedly improved emulsion stability (over a duration of 50 days), even at low proportions of the said comonomer units. This excellent behavior is also found in copolymeric polyvinyl alcohols according to the invention containing perfluorohexylethylene or allyl tetrafluoroethyl ether as the fluorine-containing comonomer.

The fluorine-containing, copolymeric polyvinyl alcohols according to the invention produce a notably higher emulsion stability and/or exhibit an increase capacity for emulsification, in comparison with known polyvinyl alcohols or known fluorine-containing, copolymeric polyvinyl alcohols.

For example, the surface tension of water can be reduced, compared with pure water/air ($T = 20°$ C.), from 73 dynes/cm to approx. 45 dynes/cm by adding a fluorine-containing, terpolymeric polyvinyl alcohol according to the invention in a concentration range from 0.05 to 0.6 g/100 ml.

The invention also relates to copolymers containing carboxyl groups.

If vinyl esters, for example vinyl acetate, are copolymerized under normal conditions with, for example, crotonic acid or maleic acid, and if the resulting copolymers are saponified to give the acid-modified, copolymeric polyvinyl alcohols, polyvinyl alcohols are obtained which have a low viscosity in a 4% strength by weight aqueous solution.

The viscosity of a 10% strength by weight aqueous solution, measured at 85° C. in a Rheomat 30 made by Contraves, is outside the range of 60–120 mPa.s which is desirable for sizes. Although the products are soluble in alkali, which is considered an important requirement for use as sizing agents, the resulting films are brittle.

It has now been found, surprisingly, that if the copolymerization is carried out using a third copolymerizable, monomeric component besides vinyl acetate and crotonic acid, specifically an unsaturated perfluoroalkyl compound in which, in the copolymerized state, the perfluoroalkyl chain is in a side chain in relation to the main chain, a quaterpolymer which no longer has the defects described above is obtained from the copolymer by partial saponification.

A further surprising fact is that, even at low contents of fluorine-containing comonomer according to the invention in the quaterpolymeric polymer, as marked effect can be observed in respect of viscosity.

Clear films which are smooth and flexible at room temperature and 50% relative humidity are obtained. The water absorption, measured after an operating time of 8 days at 65% and 85% relative humidity, ranges between 5 and 40% by weight, preferably between 8 and 25% by weight.

The viscosity values of a 10% strength by weight aqueous solution, measured at 85° C. in a Contraves Rheomat 30, can cover a wide range from 5 to 180 mPa.s, preferably 35 to 140 mPa.s and especially 60–120 mPa.s, depending on the proportion of comonomer used.

It is thus possible, depending on the content of fluorine-containing comonomer, to adjust the viscosity to a desired figure at a specific content of carboxyl groups. The products are thus excellently suitable for use in the size field. A further surprising fact is the high viscosity stability over a prolonged period at elevated temperatures and the good stability to shear. The products are therefore also suitable for use in aqueous hydraulic fluids.

These fluorine-containing copolymers according to the invention and containing carboxyl groups can be prepared by the (mass) batch process or by the metering process.

It is preferable to use the metering process. The components employed can preferably be, for example, the following comonomers:

A. Vinyl esters, for example vinyl formate, vinyl acetate, vinyl propionate, vinyl butyrate, vinyl laurate and vinyl stearate and also vinyl esters of branched carboxylic acids having 10–12 carbon atoms. They can be employed on their own or as a mixture with one another. It is preferable to use vinyl acetate.

B. Amongst the fluorine-containing comonomers, those having long-chain perfluoroalkyl radicals are preferred over those having short-chain perfluoroalkyl radicals. This is important, in particular, for the technical properties in use of the copolymeric polyvinyl alcohols prepared from the terpolymers by saponification.

The fluorinated comonomers employed are, therefore, preferably those containing a perfluorinated alkyl radical having 4–20, preferably 5–15 and especially 6–8, carbon atoms. The perfluorinated alkyl radical can also be attached to the ethylenically unsaturated grouping of the compound via an oxygen atom.

Perfluorohexylethylene and perfluorooctylethylene are particularly preferred fluorine-containing comonomers.

C. The acid component originates from the group of unsaturated monocarboxylic and dicarboxylic acids corresponding to the general formula II.

The following may be mentioned as examples of $\alpha,\beta$-unsaturated monocarboxylic acids: acrylic acid, methacrylic acid, crotonic acid, vinylacetic acid and allylacetoacetic acid.

Dicarboxylic acids (unsaturated), such as, for example, maleic, fumaric, itaconic or citraconic acid, can also be used with advantage.

During the polymerization, organic solvents can also be added to the reaction mixture as a diluent. Methanol or ethanol is preferred in this respect, but particularly methanol.

The preparation of these copolymers according to the invention can be effected by simple free radical polymerization, two mixtures being prepared, one of which is initially taken in the reaction vessel (mixture I), while the other (mixture II) is metered in. The mixture initially taken in the reaction vessel (mixture I) is composed, for example, of vinyl acetate and the total amount of an initiator suitable for elevated temperatures.

The amount of mixture I is about 10% by weight of the total amount of vinyl acetate.

Examples of initiators which are particularly preferred for elevated temperatures of 65°–90° C. are peroxides, such as dibenzoyl peroxide. Per-esters, such as t.-butyl per-2-ethylhexanoate, are employed in an amount of 0.01–1.0% by weight, preferably 0.1–0.6% by weight, relative to the vinyl ester.

The mixture II is composed of the remainder of the vinyl acetate and the monomeric carboxylic acid and the monomeric perfluoroalkyl compound. Crotonic acid, in an amount of 0.5–8% by weight, in particular 1–6% by weight and preferably 1.5–5% by weight, relative to the total mixture excluding initiator, is preferably employed as the carboxylic acid.

Examples of perfluoroalkyl compounds which are particularly preferred are the comonomers perfluorohexylethylene and perfluorooctylethylene. They are present in the total mixture at a concentration of 0.05–10% by weight, preferably 0.1–5% by weight and particularly 0.2–3% by weight.

Polymerization is carried out by heating the initially taken mixture I to 70°–80° C. When the polymerization reaction sets in, a start is made with metering in the mixture II. Metering in is carried out for 1–6 hours, preferably for 3 hours. The polymerization temperature is kept constant during this time. After the temperature of the reaction mixture has risen by 1°–5° C., preferably 1°–2° C., dilution is carried out in stages with an organic solvent, such as, for example, methanol. In the further course of the polymerization, additional amounts, preferably 0.1–0.3% by weight, relative to the total concentration of monomers, of initiator, such as, for example, bis-(4-tert.-butylcyclohexyl)peroxodicarbonate or bis-(cyclohexyl)peroxodicarbonate, are added to the reaction mixture in order to increase the conversion. Further solvent is used for dilution in the course of the polymerization reaction; an approx. 40% strength by weight solution is obtained at the end of the reaction.

Because of the low content of residual monomer, solutions diluted in this manner can be employed directly for saponification to give the quater-polymer according to the invention.

The saponification and/or the alcoholysis process are carried out in the presence of a basic catalyst. The catalyst preferably used is an alkali metal hydroxide or alkali metal alcoholate. Examples of suitable saponifying agents are sodium hydroxide, potassium hydroxide, $NH_3$, sodium methylate, ethylate, and propylate and potassium methylate, ethylate and propylate. The catalyst is employed in the form of a solution, an alkanol of the type mentioned above preferably being used as the solvent. The amount of a, for example 10% strength by weight, solution of the catalyst in the alkanol can usually be 0.1–10% by weight, preferably 0.4–3% by weight, relative to the copolymeric polyvinyl ester component. In general, the concentration of the catalyst in the alcoholic catalyst solution used is preferably within the range from 5 to 25% by weight, advantageously 8 to 20% by weight.

In order to establish definite conditions, i.e. a definite degree of hydrolysis at constant overall conditions, it is absolutely necessary to neutralize the carboxyl groups of the copolymeric acid components with equimolar amounts of alkali.

The degree of saponification of the saponifiable vinyl ester structural units is within the range from 40 to 100, preferably 60 to 99 and particularly 88 to 98, mole %.

In addition to the uses already described for the fluorine-containing copolymers according to the invention, mention should also be made of their use as components of adhesives and for modifying the surface of organic and/or inorganic substrates, and also as a constituent in photosensitive layers, in particular in photosensitive printing plates, and as an auxiliary in tertiary petroleum extraction.

The invention is illustrated in greater detail by means of the examples below.

EXAMPLE 1

Preparation of a vinyl ester copolymer 3960 g of vinyl acetate, to which 40 g of perfluorohexylethylene and 13.33 g of dibenzoyl peroxide (75% strength by weight) have been added, are initially placed in a 15 l reaction apparatus equipped with a stirrer, a thermometer and a reflux condenser. The reaction mixture is heated to 73° C. After a polymerization time of 50 minutes, the mixture is diluted to an 80% strength mixture by weight with 1000 g of methanol and is kept at 60° C. In the course of the polymerization, the solution is diluted in stages from 80% strength by weight via 70% and 60% to a 50% strength by weight methanolic solution. The temperature rises to 65° C. in the course of the polymerization. After 5 hours 2 kg of methanol are added to the reaction solution, and the latter is then distilled in order to free it from monomeric vinyl acetate.

The yield is 2834 g of copolymer. The copolymer obtained has a reduced specific viscosity of 99.7 ml/g, measured on a solution of the copolymer having a concentration c of 1.02 g/100 ml at 25° C. in ethyl acetate.

EXAMPLE 2

Preparation of a terpolymer from the vinyl ester copolymer of Example 1 by saponification 500 g of a vinyl acetate copolymer prepared in accordance with Example 1 are dissolved in 1500 g of methanol, and 40 g of water as well as 40 g of 10% strength by weight methanolic sodium hydroxide solution are added to the solution at a temperature of 22° C.

The mixture is homogenized by being stirred for approx. 5 minutes. The resulting alkaline gel is then ground and, 51 minutes later, neutralized with 6 ml of concentrated acetic acid in 500 g of methanol.

A terpolymer containing vinyl alcohol units and having an acetyl content of 15.4% strength by weight, corresponding to a degree of hydrolysis of 81.4 mole %, is obtained.

The product is only partly soluble in water.

EXAMPLE 3

Preparation of a vinyl ester copolymer

A mixture of 1485 g of vinyl acetate, 15 g of perfluoropropyl vinyl ether, 5 g of dibenzoyl peroxide (75% strength by weight) and 643 g of methanol is charged into a 3 l autoclave equipped with a stirrer. The mixture is heated to 80° C. and is copolymerized for 5 hours at this temperature and under an autogenous pressure of 1.5–1.8 bar.

In the course of the polymerization, the solution is diluted from 70% by weight to 60% by weight by adding methanol. After the solution has been dried, 1395 g of solid copolymer containing 0.97% by weight of perfluoropropyl vinyl ether units are obtained. This last proportion of comonomer was determined via analysis for fluorine.

EXAMPLE 4

Preparation of a terpolymer from the vinyl ester copolymer of Example 3 by saponification 500 g of the copolymer prepared in accordance with Example 3 are dissolved in 1167 g of methanol. 40 g of $H_2O$ and 40 g of 10% strength by weight methanolic sodium hydroxide solution are added to this solution and homogenization is carried out by stirring for approx. 5 minutes. The resulting solid, alkaline gel is ground and, 47 minutes later, neutralized with 6 ml of concentrated acetic acid in 500 g of methanol. The neutralized product is washed in methanol and then suction-drained on a suction filter, and the solid product is dried in a drying cabinet.

256 g of a terpolymer containing fluorine and vinyl alcohol units and having a degree of hydrolysis of 84.6 mole % are obtained.

Fluorine analysis indicates a content of 1.56% by weight of fluorine-containing comonomer units, relative to the terpolymer. The viscosity of a 4% strength by weight aqueous solution of the terpolymer is 4.2 mPa.s.

EXAMPLE 5

Preparation of a vinyl ester copolymer

A mixture of 3992 g of vinyl acetate, 8 g of perfluorohexylethylene and 13.33 g of dibenzoyl peroxide (75% strength by weight) is initially placed in a reaction apparatus according to Example 1 and is heated to 75° C. and subjected to mass polymerization for 30 minutes. After 30 minutes, the mixture is diluted with methanol to a solids content of 80% by weight. The reaction temperature is kept at 62° C. During the further course of the polymerization the solution is diluted with methanol to 30% strength by weight, and, 5 hours later, the solvent and the volatile constituents are removed by distillation. The yield is 3178 g of copolymer.

The reduced specific viscosity of the copolymer is 127.4 ml/g at a concentration c of 1.07 g/100 ml, measured in ethyl acetate at 25° C.

EXAMPLE 6

Preparation of a terpolymer from the vinyl ester copolymer of Example 5 by saponification.

75 g of 10% strength by weight methanolic sodium hydroxide solution are added to 2240 g of a 25% strength by weight methanolic solution of the copolymer prepared in accordance with Example 5. When the gel phase reaction and the grinding of the gel product are complete, methanol and 11.25 ml of concentrated acetic acid, for neutralization, are added to the resulting granules. The saponification time is 45 minutes. The product is a terpolymer containing vinyl alcohol units and having a degree of hydrolysis of 95.8 mole %. The analytical determination of the fluorine content of this product indicates a comonomer content of perfluorohexylethylene units of 0.40% by weight, relative to the terpolymer. The Höppler viscosity of a 4% strength by weight aqueous solution is 26.2 mPa.s.

EXAMPLE 7

Preparation of a vinyl ester copolymer

Copolymerization of a mixture of 792 g of vinyl acetate and 8 g of perfluorooctylethylene and 2.66 g of dibenzoyl peroxide is carried out similarly to Example 1, but in a 6 l reaction flask equipped with a reflux condenser, a thermometer and a stirrer.

The conversion in the reaction is 72.9% by weight, relative to the total amount of monomers employed.

The resulting copolymer has a reduced specific viscosity of 102.8 ml/g, measured in ethyl acetate at 25° C.

EXAMPLE 8

Preparation of a terpolymer by saponification of a vinyl ester copolymer 560 g of a vinyl acetate copolymer containing 1% by weight of perfluorooctylethylene units are dissolved in methanol. The solids content of the solution is adjusted to 25% by weight. 7% by weight of water, relative to the copolymer, and 0.7% by weight of 10% strength by weight methanolic sodium hydroxide solution are added to this solution.

The saponification temperature is 23° C. After 60 minutes, the resulting gel is granulated in a mill, and the saponification reaction is stopped by adding 5.9 ml of acetic acid in 500 g of methanol.

The resulting terpolymer has a degree of hydrolysis of 85 mole % and contains 2.07% by weight of perfluorooctylethylene units, as determined by analysis. It is only partly soluble in water and tends to form a gel.

EXAMPLE 9

Preparation of a vinyl ester copolymer 16 g of allyl tetrafluoroethyl ether, 784 g of vinyl acetate and 2.66 g of dibenzoyl peroxide (75% strength by weight) are polymerized for 6.5 hours on the apparatus described in Example 7. During the course of the polymerization, 807 g of methanol are added to the mixture as a solvent.

The reaction takes place with a conversion of 69.2% by weight, relative to the total amount of monomers employed.

The reduced specific viscosity of the resulting copolymer is 90.5 ml/g, measured in ethyl acetate at 25° C. (c=1.01 g/100 ml).

EXAMPLE 10

Preparation of a vinyl ester copolymer 100 g of vinyl acetate, 100 g of perfluorohexylethylene and 0.33 g of dibenzoyl peroxide are polymerized for 8 hours at 75° C., under reflux, in the apparatus described in Example 7. After 100 g of methanol have been added, polymerization is continued for a further 6 hours. After 390 g of ethyl acetate have been added, the reaction solution is concentrated and/or distilled on a rotary evaporator. The conversion is 64.2% by weight, relative to the total amount of monomers employed. The resulting copolymer has a reduced specific viscosity of 20.4 ml/g (c=1.0 g/100 ml), measured in ethyl acetate at 25° C.

EXAMPLE 11

Preparation of a vinyl ester copolymer

A mixture of 975.1 g of vinyl acetate and 3.27 g of dibenzoyl peroxide is sucked into a 3 l autoclave under a slight vacuum via a gas vessel containing 4.9 g of hexafluoroisobutene.

The subsequent copolymerization of the mixture is carried out at 70° C. for a polymerization time of 5 hours. In the course of the polymerization, the batch is diluted with 960 g of methanol.

The copolymer obtained contains 0.5% by weight of hexafluoroisobutene and has a reduced specific viscosity of 89.2 ml/g, measured in ethyl acetate at 25° C. at a concentration c of 1.01 g/100 ml.

EXAMPLE 12

Preparation of a vinyl ester copolymer 16 g of allyl hexafluoropropyl ether are mixed with 784 g of vinyl acetate and 2.66 g of dibenzoyl peroxide and are polymerized in the apparatus described in Example 7 at 40° C. for 5.5 hours. During the polymerization 807 g of methanol are added to the batch.

The yield is 604.5 g of copolymer having a reduced specific viscosity of 92.1 ml/g (c=1.02 g/100 ml), measured in ethyl acetate at 25° C.

EXAMPLE 13

Preparation of a vinyl ester copolymer and the saponification thereof

A mixture of 3980 g of vinyl acetate, 20 g of perfluorooctylethylene and 0.25% by weight, relative to vinyl acetate, of dibenzoyl peroxide, as initiator, is prepared for polymerization by the metering process in a reaction apparatus corresponding to Example 1, but equipped with a metering device.

10% of this mixture are initially placed in the reaction apparatus and are heated to 62° C. When the reaction begins, a start is made with metering in the remaining 90% of the mixture. Metering is carried out for 3 hours via a metering unit. 25 minutes before the end of the metering, methanol is fed in via a further metering device to the reaction mixture, as a diluent. 3 hours and 40 minutes of subsequent polymerization at a temperature of 61°–64° C. gives a polymer solution containing 31.9% by weight of polymer, corresponding to a residual monomer content of 8.1% by weight.

The remaining vinyl acetate is removed by vacuum distillation while further methanol is added. The copolymer has a reduced specific viscosity of 139.1 ml/g at c=1.0 g/100 ml, measured in ethyl acetate at 25° C. Saponification to give the terpolymer is carried out in accordance with Example 2.

The resulting terpolymer has a degree of hydrolysis of 86.3 mole %, and the solution viscosity (Hoppler) of a 4% strength by weight aqueous solution is 754.0 mPa.s.

The product is homogeneous and forms a clear solution in water.

EXAMPLES 14–18

Preparation of vinyl ester copolymers

Mixtures of 4000 g in each case, composed of vinyl acetate and varying amounts of perfluorooctylethylene as comonomer, are copolymerized in accordance with the procedure of Example 1. Polymerization is carried out under reflux for 7.5 hours.

The properties of the resulting copolymers in relation to the viscosity as a function of the comonomer content are listed in Table 1.

The contents of comonomer in the polyvinyl acetate copolymer were determined quantitatively by fluorine analysis.

TABLE 1

The viscosity behavior of the vinyl ester copolymers of Examples 14–18

| Example No. | $\eta$ sp/c[1] [ml/g] | $Y^2$ (% by weight) |
|---|---|---|
| 14 | 136.5 | 0.11 |
| 15 | 120.0 | 0.22 |
| 16 | 113.9 | 0.32 |
| 17 | 115.0 | 0.41 |
| 18 | 124.0 | 0.50 |

[1] $\eta$ sp/c = reduced specific viscosity, quoted in [ml/g] and measured in ethyl acetate at 25° C. on a solution of the copolymer of concentration c = 1 g/100 ml.
[2] Y = proportion (in % by weight) of comonomeric perfluorooctylethylene units in the copolymer, relative to the copolymer.

The properties of the terpolymers prepared by the method of Example 2 by saponifying the vinyl ester copolymers obtained in Examples 14 to 18 are listed in Table 2.

TABLE 2

The viscosity behavior of the terpolymers prepared by saponification from the vinyl ester copolymers of Examples 4–18

| Example No. | $DH^3$ (mole %) | $\eta^4$ (mPa.s) | $Z^5$ (% by weight) |
|---|---|---|---|
| 14 | 86.4 | 22.8 | 0.18 |
| 15 | 86.6 | 41.5 | 0.37 |
| 16 | 86.5 | 86.8 | 0.53 |
| 17 | 87.1 | 228.0 | 0.72 |
| 18 | 87.0 | 449.3 | 0.94 |

[3] DH = degree of hydrolysis (in mole %) of the vinyl ester units in the terpolymer
[4] $\eta$ = viscosity of a 4% strength by weight aqueous solution of the terpolymer, measured in a Hoppler viscometer at 23° C.
[5] Z = proportion (in % by weight) of comonomeric perfluorooctylethylene units in the terpolymer, relative to the terpolymer.

COMPARISON EXAMPLE A

Preparation of polyvinyl acetate 1000 g of vinyl acetate are subjected to homopolymerization for 8 hours at 60°–75° C. in a polymerization apparatus according to Example 7. 0.25% by weight, relative to vinyl acetate, of 75% strength by weight dibenzoyl peroxide is used as the initiator. During the polymerization the polymerization solution is diluted in stages with methanol to a methanol content of 50% by weight, the polymerization reaction is terminated by adding hydroquinone, and the mixture is diluted with further methanol to a methanol content of 40% by weight. The resulting solution of polymer has a residual monomer content of 4.47% by weight.

The reduced specific viscosity of the resulting polyvinyl acetate is 125.8 ml/g at a concentration c of 1.0 g/100 ml and at a temperature of 25° C. (Ostwald viscometer), measured in ethyl acetate.

COMPARISON EXAMPLE B

Preparation of polyvinyl alcohol by saponifying homopolymeric polyvinyl acetate 800 g of the polyvinyl acetate homopolymer prepared in Comparison Example A are dissolved in 2400 g of methanol. This solution is then subjected to a treatment analogous to that in Example 8. The saponification temperature is 22° C.

After 90 minutes the saponification reaction is terminated by pouring the granulated saponification product into a mixture of 8.4 ml of concentrated acetic acid and 800 g of methanol. The product is then dried at 70° C. in a vacuum cabinet. This gives a polyvinyl alcohol homopolymer having a degree of hydrolysis of 85.7 mole % and a Höppler viscosity of 14.9 mPa.s.

A 4% strength by weight aqueous solution of the product is homogeneous and exhibits no turbidity at all.

Compared with the products, according to the invention, of Examples 14–18, the comparison product obtained has a markedly lower viscosity.

COMPARISON EXAMPLE C

Preparation of a polyvinyl alcohol containing tetrafluoroethylene (TFE) units 400 g of a tetrafluoroethylene/vinyl acetate copolymer having a TFE content of 2.7% by weight are dissolved in 2267 g of methanol. The copolymer has a reduced specific viscosity of 359.4 ml/g in ethyl acetate at 25° C. and a concentration c of 1.02 g/100 ml.

28 g of water and 32 g of 10% strength by weight methanolic sodium hydroxide solution are introduced, with vigorous stirring, into a 15% strength by weight solution of the polymer in methanol. After 94 minutes the alkaline product, which is in the form of granules, is neutralized in a mixture of 400 g of methanol and 4.8 ml of concentrated acetic acid.

The resulting modified polyvinyl alcohol contains 4.1% by weight of copolymerized tetrafluoroethylene. The degree of hydrolysis is 85.9 mole%. The Höppler viscosity of a 4% strength by weight aqueous solution is 40.4 mPa.s, measured at 23° C.

The aqueous solution is cloudy and has a deposit after standing for a prolonged period.

COMPARISON EXAMPLE D

In order to achieve a higher degree of hydrolysis, the product from Comparison Example C is treated with 1.5% by weight of 10% strength by weight methanolic sodium hydroxide solution at room temperature. The methanolysis reaction is terminated after 3 hours by means of equimolar amounts of concentrated acetic acid in 400 g of methanol.

The resulting TFE-containing, terpolymeric polyvinyl alcohol containing 4.5% by weight of tetrafluoroethylene units has a degree of hydrolysis of 97.4 mole %.

The Höppler viscosity of a 4% strength by weight aqueous solution is 68.2 mPa.s, measured at 23° C.

The aqueous solution is homogeneous and clear and exhibits no phase separation even after standing for a prolonged period.

If the appropriate viscosities of aqueous polyvinyl alcohol solutions from Example 18 and Comparison Example B are compared with one another, the difference according to the invention becomes clear. At approximately equal reduced specific viscosities of the starting polyvinyl acetate solutions in ethyl acetate, Example 18 at 124 ml/g and Comparison Example A at 125.8 ml/g, the viscosity of the aqueous solution of the polyvinyl alcohol according to the invention from Example 18 differs by the considerable factor of 30.2 from the viscosity of the aqueous solution of the comparison product from Comparison Example B at the same concentration.

In contrast with the polyvinyl acetates, modified in accordance with the invention, of Examples 14–18, the polyvinyl acetate modified by tetrafluoroethylene units (Comparison Example C) has a high reduced specific viscosity in the solvent ethyl acetate, which results in considerable dissolving problems, for example in methanol, and makes the preparation of methanolic solutions of fairly high concentrations considerably more difficult or can even render this impossible. Surprisingly, however, the polyvinyl acetates, modified in accordance with the invention, of Examples 14–18 do not have this disadvantage.

On the other hand, however, aqueous solutions of the terpolymeric polyvinyl alcohols obtained by hydrolysis in Comparison Example D from products of Comparison Example C exhibit low solution viscosities, inspite of the high viscosity of methanolic solutions of the modified starting polyvinyl acetates from Comparison Example C on which they are based. In this pattern of properties, the products according to the invention differ fundamentally and clearly from the state of the art.

EXAMPLE 19

Preparation of a vinyl ester terpolymer containing crotonic acid and perfluorohexylethylene 76.4 g of a mixture of 760 g of vinyl acetate and 4 g of t.-butyl per-2-ethylhexanoate as initiator (mixture I) are initially placed in a reaction apparatus corresponding to Example 7, but additionally equipped with a metering device.

A mixture (mixture II) composed of 687.6 g of mixture I, 32.0 g of crotonic acid and 8.0 g of perfluorohexylethylene is prepared as the solution to be metered in from a 1 l metering funnel.

Mixture I, which was initially taken, is heated to 73° C. When this temperature has been reached, a start is made with metering in mixture II. Mixture II is metered in for 3 hours. The polymerization temperature is kept between 73° and 74° C. during this time. The bath temperature is kept constant at 80° C. for the entire duration of the polymerization. If the internal temperature exceeds 75° C. about 45–60 minutes after the end of metering in mixture II, the reaction solution is diluted in stages with 89 g, 111 g, 143 g and 190 g of methanol. The reaction temperature falls to 60° C. after the first addition of methanol and rises to 65° C. in the further course of the polymerization.

1.6 g of bis-(4-t.-butylcyclohexyl)peroxodicarbonate are added, as an initiator, to the reaction solution one hour after, and again three hours after, the metering in of the mixture II has been completed.

5¼ hours after the end of metering in mixture II, the polymerization solution is diluted with a further 667 g of methanol, the polymerization reaction is terminated by adding 50 mg of hydroquinone, and the mixture is cooled to room temperature. The resulting 40% strength by weight methanolic solution has a residual monomer content of 1.69% by weight.

768 g of vinyl acetate terpolymer are obtained after drying at 70° C. in vacuo. The crotonic acid content is determined titrimetrically by conventional methods.

The reduced specific viscosity of the product at 25° C. in ethyl acetate is found to be 81.3 ml/g, at a concentration c in the ethyl acetate solution of 1.05 g/100 ml.

EXAMPLE 20

Saponification of the terpolymeric polyvinyl acetate described in Example 19 to give the quaterpolymeric polyvinyl alcohol 700 g of the polyvinyl acetate terpolymer prepared in accordance with Example 19 and containing 0.34 mole % of crotonic acid are dissolved in 1633 g of methanol. Equimolar amounts of 10% strength by weight methanolic sodium hydroxide solution are added to neutralize the carboxyl groups, and 280 g of 10% strength by weight metanolic NaOH solution are added as a saponification catalyst.

The mixture is homogenized by stirring for approx. 2 minutes. The resulting solid, alkaline gel is ground and, 45 minutes later, neutralized with 62.4 g of acetic acid, with the addition of 700 g of methanol in the course of 1 hour. The neutralized product is washed with methanol and then suction-drained on a suction filter, and the solid product is dried in a drying cabinet. This gives 341 g of quaterpolymeric polyvinyl alcohol having a solids content of 97% by weight.

The degree of hydrolysis is 95 mole %. The viscosity of a 4% strength by weight aqueous solution, measured at 23° C. in a Höppler viscometer, is found to be 21.1 mPa.s.

The 10% strength by weight aqueous solution has a viscosity of 85.5 mPa.s, measured at 85° C. in a Contraves Rheomat 30. The product has an excellent solubility in alkali.

EXAMPLE 21

76.7 g of a mixture of 761.6 g of vinyl acetate and 5.33 g of dibenzoyl peroxide (mixture I) are initially placed in an apparatus according to Example 19.

32 g of crotonic acid and 6.4 g of perfluorooctylethylene are added to 690.2 g of mixture I (mixture II).

The portion of mixture I initially taken is heated to 74° C.; when this temperature has been reached a start is made with metering in mixture II, which takes 3 hours. The subsequent procedure is in accordance with Example 19.

At the end of the polymerization period, a methanolic solution of polyvinyl acetate terpolymer (40% strength by weight) having a residual monomer content of 1.48% by weight if obtained.

757 g of terpolymer are obtained after drying. The 1% strength by weight solution in ethyl acetate has a reduced specific viscosity $\eta sp/c$ of 59.4 ml/g.

The content of crotonic acid units in the terpolymer can be determined titrimetrically to be 4.5% by weight.

EXAMPLE 22

Saponification of the polyvinyl acetate terpolymer prepared in accordance with Example 21 to give the polyvinyl alcohol quaterpolymer is carried out in accordance with Example 20. The polyvinyl alcohol modified according to the invention has a degree of hydrolysis of 94.9 mole % and a 4% strength by weight aqueous solution of it has a viscosity of 23.4 mPa.s at 23° C. (Hoppler).

The 10% strength by weight aqueous solution of the polyvinyl alcohol quaterpolymer has a viscosity of 134.7 mPa.s, measured at 85° C. using a Rheomat 30.

COMPARISON EXAMPLE E

Preparation of copolymeric polyvinyl acetate containing carboxyl groups 390 g of a mixture of 3880 g of vinyl acetate and 20 g of t.-butyl per-2-ethylhexanoate, as initiator, are initially placed in a reaction apparatus according to Example 13. The remaining 90% of the mixture are mixed with 120 g of crotonic acid and are metered into the initial mixture in the course of 3 hours. The subsequent procedure in the test is analogous to that described in Example 3.

The methanolic reaction solution, which is 40% strength by weight, has a residual monomer content, determined titrimetrically, of 0.3% by weight.

The reduced specific viscosity $\eta$ sp/c of the copolymer, measured in ethyl acetate at 25° C. and at a concentration c of 1.0 g/100 ml, is 86.7 ml/g.

The crotonic acid content of the copolymer is determined titrimetrically to be 3.2% by weight.

COMPARISON EXAMPLE F

Saponification of the copolymeric polyvinyl acetate containing crotonic acid described in Comparison Example E 2522 g of a 39.65% strength by weight methanolic solution of the copolymer synthesized in Comparison Example E are diluted with 811 g of methanol. In order to neutralize the crotonic acid component in the copolymer, amounting to 3.2% by weight, a further 150 g of 10% strength by weight methanolic sodium hydroxide solution are added to the polymer solution in addition to 300 g of 10% strength by weight methanolic sodium hydroxide solution added for saponification. The solid gel formed during the alkaline transesterification reaction is ground and, 45 minutes later, neutralized with 67.5 g of concentrated acetic acid, with the addition of 1000 g of methanol in the course of one hour. The neutralized product is washed with further methanol and suction-drained on a suction filter and then dried at 70° C. in a vacuum drying cabinet. The resulting terpolymer containing crotonic acid has a degree of hydrolysis of 95.3 mole %. The viscosity, measured in a Höppler viscometer, of a 4% strength by weight aqueous solution of the terpolymer at 23° C. is 9.8 mPa.s at a pH of 7.0. A 10% strength by weight aqueous solution of the terpolymer has a viscosity of 20.8 mPa.s at 85° C. The product is readily soluble in alkali.

In spite of the modified polyvinyl acetate according to the invention having a markedly lower reduced specific viscosity of 59.4 ml/g in ethyl acetate (25° C.) at a concentration of 1 g/100 ml (Example 21), compared with 86.7 ml/g of the product described in Comparison Example E, an aqueous solution of the polyvinyl alcohol, modified according to the invention, from Example 22 has a considerably higher viscosity, 23.4 mPa.s at 23° C. and a concentration of 4% by weight, than the viscosity, 9.8 mPa.s, under identical conditions of the comparison product from Comparison Example F.

A substantially more pronounced difference is shown by the viscosities of 10% strength by weight aqueous solutions, measured at 85° C.

The viscosity range of 60–120 mPa.s (10% strength by weight solution, 85° C.) in water, which is specified and required for a fiber yarn sizing material, is not achieved by the comparison product from Comparison Example F. The latter is therefore not suitable for use as a fiber yarn sizing agent.

A further surprising fact is that, inspite of the product from Example 22 having a higher crotonic acid content than the product from Comparison Example F, the viscosity in water of the hydrolysis product, according to the invention, from Example 22 is markedly higher, although a higher crotonic acid content during the polymerization under conditions not in accordance with the invention would have been expected to reduce the viscosity in water of the corresponding polyvinyl alcohols.

We claim:

1. A fluorine-containing copolymer prepared by free-radical-initiated copolymerization of ethylenically-unsaturated, copolymerizable monomers and containing, as monomer units, those of the following monomers:
   (a) vinyl ester of saturated aliphatic carboxylic acid having from 1 to 18 carbon atoms,
   (b) from 0.05 to 20% of fluorine-containing ethylenically-unsaturated monomer of the formula

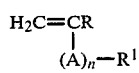

in which
   R denotes —H, or —$CH_3$,
   A denotes —$CH_2$—, —O—, —$CH_2$—O—($CH_2$)$_m$— or

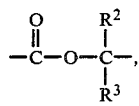

$R^1$ denotes —$C_pF_{2p+1}$, —$C_pF_{2p}X$ or —$C_pF_{2p-1}XH$, each of which is linear or branched,
   each of $R^2$ and $R^3$ is independently, —H, ($C_1$-$C_4$)-alkyl, —$CF_3$ or $R^1$,
   X denotes halogen,
   m denotes 0 to 2,
   n denotes 0 to 1, and
   p denotes 2 to 20,
   (c) optionally, ethylenically-unsaturated monocarboxylic acid,
   (d) optionally, ethylenically-unsaturated dicarboxylic acid, and
   (e) optionally, other ethylenically-unsaturated monomer; each of (c) and (d) being monomer of the formula

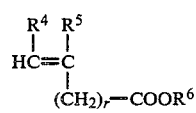

in which
   $R^4$ denotes —H, —COOH or ($C_1$-$C_5$)-alkyl,
   $R^5$ denotes —H, —$CH_3$ or —COOH,
   $R^6$ denotes —H, —$NH_4$, —Na, —K or —Li, and
   r denotes 0 to 5;
   each vinyl ester unit being, independently, saponified to a vinyl alcohol unit or unsaponified, and each fluorine-containing unit having, as a side chain, a fluorocarbon group containing at least two adjacent carbon atoms having an F—C bond.

2. A fluorine-containing copolymer as claimed in claim 1 wherein A denotes —$CH_2$—.

3. A fluorine-containing copolymer as claimed in claim 1 wherein A denotes —$CH_2$—O—($CH_2$)—.

4. A fluorine-containing copolymer as claimed in claim 1 wherein A denotes:

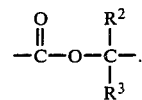

5. A fluorine-containing copolymer as claimed in claim 1 wherein n denotes 0.

6. A fluorine-containing copolymer as claimed in claim 1 wherein A is —O—.

7. A fluorine-containing copolymer as claimed in claim 1 wherein $R^2$ is —$CF_3$ or one of the meanings of $R^1$.

8. A fluorine-containing and at least partially saponified copolymer prepared by free-radical-initiated copolymerization of ethylenically-unsaturated, copolymerizable monomers and containing, as monomer units, those of the following monomers:
   (a) vinyl ester of saturated aliphatic carboxylic acid having from 1 to 18 carbon atoms,
   (b) fluorine-containing ethylenically-unsaturated monomer of the formula

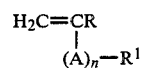

in which
   R denotes —H, or —$CH_3$,
   A denotes —$CH_2$—, —O—, —$CH_2$—O—($CH_2$)$_m$— or 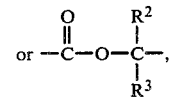

$R^1$ denotes —$C_pF_{2p+1}$, —$C_pF_{2p}X$ or —$C_pF_{2p-1}XH$, each of which is linear or branched,
   each of $R^2$ and $R^3$ is, independently, —H, ($C_1$-$C_4$)-alkyl, —$CF_3$ or $R^1$,
   X denotes halogen,
   m denotes 0 to 2,
   n denotes 0 to 1, and
   p denotes 2 to 20,
   (c) optionally, ethylenically-unsaturated monocarboxylic acid,
   (d) optionally, ethylenically-unsaturated dicarboxylic acid, and
   (e) optionally, other ethylenically-unsaturated monomer; each of (c) and (d) being monomer of the formula

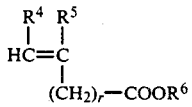

in which
R⁴ denotes —H, —COOH or (C₁-C₅)-alkyl,
R⁵ denotes —H, —CH₃ or —COOH,
R⁶ denotes —H, —NH₄, —Na, —K or —Li, and
r denotes 0 to 5;
each vinyl ester unit being, independently, saponified to a vinyl alcohol unit or unsaponified, at least some of the vinyl ester units being saponified, and each fluorine-containing unit having, as a side chain, a fluorocarbon group containing at least two adjacent carbon atoms having an F—C bond.

9. A copolymer as claimed in claim 1 which contains, as monomer units, those of the ethylenically-unsaturated monocarboxylic acid.

10. A copolymer as claimed in claim 1 which contains, as monomer units, those of the ethylenically-unsaturated dicarboxylic acid.

11. A fluorine-containing copolymer as claimed in claim 1, wherein the vinyl ester is vinyl acetate.

12. A fluorine-containing copolymer as claimed in claim 1, which contains monocarboxylic and/or dicarboxylic acid units of formula II

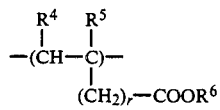

in which
R⁴ denotes H, —COOH or (C₁-C₅)-alkyl,
R⁵ denotes H, —CH₃ or —COOH, it being possible for R⁴ and R⁵ to be identical or different,
r denotes 0–5 and
R⁶ denotes H, NH₄, Na, K or Li.

13. A fluorine-containing copolymer as claimed in claim 1, wherein the degree of saponification of the vinyl ester units is 40 to 100 mole %.

14. A process for the preparation of fluorine-containing copolymer as claimed in claim 1 by free radical-initiated copolymerization of copolymerizable vinyl ester with fluorine-containing, ethylenically unsaturated monomer, optionally ethylenically unsaturated monocarboxylic and/or dicarboxylic acid and, optionally other ethylenically-unsaturated monomer, and, optionally, by subsequent partial or complete saponification of the vinyl ester units to give vinyl alcohol units, which comprises employing for the copolymerization 0.05 to 20% by weight, relative to the total amount of monomer employed, of fluorine-containing monomer in which the copolymerizable ethylene group is substituted by radicals containing fluorocarbon groups, the fluorocarbon groups being composed of at least 2 adjacent carbon atoms having F—C bonds.

15. The process as claimed in claim 14, wherein the copolymerization is carried out in the mass or in solution.

16. In a process for producing a film from a copolymer, the improvement wherein the copolymer is a fluorine-containing copolymer as claimed in claim 1.

17. In the preparation of an emulsion with an emulsifier, the improvement wherein the emulsifier is a partially or completely saponified fluorine-containing copolymer as claimed in claim 8.

18. In a process for stabilizing colloidal particles against coagulation by electrolytes with a protective colloid, the improvement wherein the protective colloid is a partially or completely saponified fluorine-containing copolymer as claimed in claim 8.

19. In preparing an adhesive from copolymer components, the improvement wherein one such component is a partially or completely saponified fluorine-containing copolymer as claimed in claim 8.

20. In a process for modifying an organic and/or inorganic substrate surface with a copolymer, the improvement wherein the copolymer is a partially or completely saponified fluorine-containing copolymer as claimed in claim 8.

21. In the preparation of a photosensitive layer or a photosensitive printing plate with a copolymer, the improvement wherein the copolymer is partially or completely saponified fluorine-containing copolymer as claimed in claim 8.

22. In a process for preparing aqueous hydraulic fluid comprising a copolymer, the improvement wherein the copolymer is partially or completely saponified fluorine-containing copolymer as claimed in claim 8.

23. In a process for tertiary petroleum extraction with an auxiliary, the improvement wherein the auxiliary is partially or completely saponified fluorine-containing copolymer as claimed in claim 8.

24. In a process for coating or sizing paper with a coating or sizing agent, respectively, the improvement wherein the coating or sizing agent is a partially or completely saponified fluorine-containing copolymer as claimed in claim 8.

25. In a process for sizing a substrate, subject to such treatment, with a sizing agent, the improvement wherein the sizing agent is a partially or completely saponified fluorine-containing copolymer as claimed in claim 8.

* * * * *

UNITED STATES PATENT AND TRADEMARK OFFICE
CERTIFICATE OF CORRECTION

PATENT NO. : 4,668,749
DATED : May 26, 1987
INVENTOR(S) : GRAUN et al

It is certified that error appears in the above-identified patent and that said Letters Patent is hereby corrected as shown below:

Claim 3, line 2 (column 20, line 6), "$-CH_2-O-(CH_2)-$" should read -- $-CH_2-O-(CH_2)_m-$ --.

Signed and Sealed this

Thirteenth Day of October, 1987

*Attest:*

DONALD J. QUIGG

*Attesting Officer*  *Commissioner of Patents and Trademarks*